United States Patent [19]

Campardo et al.

[11] Patent Number: 4,874,965

[45] Date of Patent: Oct. 17, 1989

[54] CIRCUITAL DEVICE FOR THE POWER-ON RESET OF DIGITAL INTEGRATED CIRCUITS IN MOS TECHNOLOGY

[75] Inventors: Giovanni Campardo, Bergamo, Italy; David Novosel, New Wilmington, Pa.

[73] Assignee: SGS Microelettronica S.p.A., Catania, Italy

[21] Appl. No.: 125,344

[22] Filed: Nov. 25, 1987

[51] Int. Cl.[4] ............... G11C 11/00; H03K 3/01
[52] U.S. Cl. .................... 307/272.3; 307/592; 307/597; 307/279; 307/362
[58] Field of Search ............ 307/592, 594, 597, 603, 307/605, 279, 272.2, 296 R, 362, 530, 272.3

[56] References Cited

U.S. PATENT DOCUMENTS

| | | | |
|---|---|---|---|
| 3,753,011 | 8/1973 | Faggin | 307/594 |
| 4,309,627 | 1/1982 | Tabata | 307/362 |
| 4,385,245 | 5/1983 | Ulmer | 307/362 |
| 4,441,039 | 4/1984 | Schuster | 307/530 |
| 4,585,957 | 4/1986 | Ooms | 307/272.2 |
| 4,607,178 | 8/1986 | Sugie et al. | 307/362 |
| 4,654,547 | 3/1987 | Shaver | 307/530 |
| 4,695,753 | 9/1987 | Pelgrom | 307/530 |

*Primary Examiner*—Stanley D. Miller
*Assistant Examiner*—Huy Kim Mai
*Attorney, Agent, or Firm*—Wolf, Greenfield & Sacks

[57] ABSTRACT

A power-on reset circuit for supplying a reset pulse when a supply voltage rises above a preset threshold includes a reference voltage generator connected between the supply voltage and ground for supplying a reference signal having a constant preset value when the supply voltage is greater than the preset threshold. A supply follower provides an input signal which follows the supply voltage with a preset reduction factor. A bistable comparator having a first input driven by the reference signal and a second input driven by the input signal switches from a first state to a second state when the input signal exceeds the reference signal.

6 Claims, 2 Drawing Sheets

4,874,965

CIRCUITAL DEVICE FOR THE POWER-ON RESET OF DIGITAL INTEGRATED CIRCUITS IN MOS TECHNOLOGY

FIELD OF THE INVENTION

The present invention relates to a circuit for the power-on reset of integrated logical circuits in MOS technology, that is to say to a circuit adapted to changed its own output state, providing a reset pulse, in response to the simple rise of the supply voltage from a zero value to a value higher than a certain threshold, typically above 3.5-4 volts for a 5-volt power supply.

PRIOR ART

The problem of resetting integrated circuits to a preset initial condition at the moment of initial power supply was previously solved by providing, on the integrated circuit, a reset pin to which an external circuit supplied a short reset pulse as soon as the supply voltage rose above a preset threshold.

SUMMARY OF THE INVENTION

The aim of the present invention is to provide a power-on reset circuit which can be integrated on the device which employs it, thus avoiding the provision both of an external reset circuit and of an adapted reset pin on the integrated circuit, as usually occurs in the prior art.

Another object is to provide said power-on reset circuit so that it has small dimensions and has a good rejection of variations in the MOS integrated technology production process.

This aim, this object, and others which will become apparent hereinafter, are achieved by the invention with a circuital device for the power-on reset of logical integrated circuits in NMOS technology, adapted to provide a reset pulse when the supply voltage rises above a preset threshold, characterized in that it comprises:

(a) a reference voltage generator connected between the supply voltage and the ground, supplying a reference signal having a constant preset value when the supply voltage is higher than a preset threshold;

(b) a voltage follower providing an input signal which copies the behaviour of the supply voltage with a preset reduction factor; and (c) a bistable comparator having a first input driven by the reference signal and a second input driven by the input signal and switching from a first state to a second state when the input signal exceeds the reference signal.

BRIEF DESCRIPTION OF THE DRAWINGS

A preferred embodiment of the power-on reset circuit according to the invention is now described with reference to the accompanying drawings, wherein.

DETAILED DESCRIPTION OF THE PREFERRED EMBODIMENTS

Figure 1:
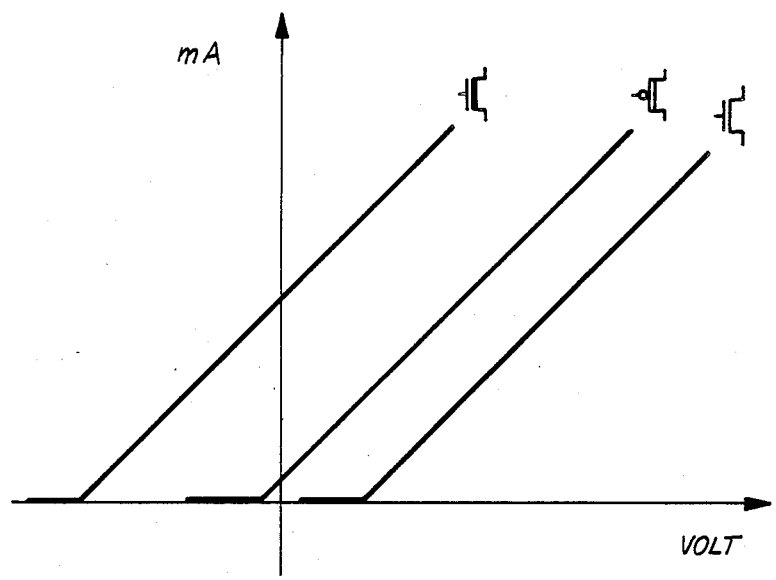
FIG. 1 is a diagram of typical characteristic curves of three types of transistors employed in the circuit according to the invention.

In the circuit diagrams, the transistors illustrated with their channels in heavy lines are depletion transistors; the transistors illustrated with their channels in broken lines are enhancement transistors; and the transistors illustrated with a small circle on the gate are natural transistors. The diagram of FIG. 1 qualitatively illustrates the typical characteristic curves of the three types of transistor. The voltage between the gate and the source is indicated in volts on the ordinate, and the current flowing through the channel is indicated in milliamperes on the abscissa.

The preferred embodiment is preferably implemented in NMOS technology, therefore with a positive supply voltage $V_{cc}$.

Figure 2:
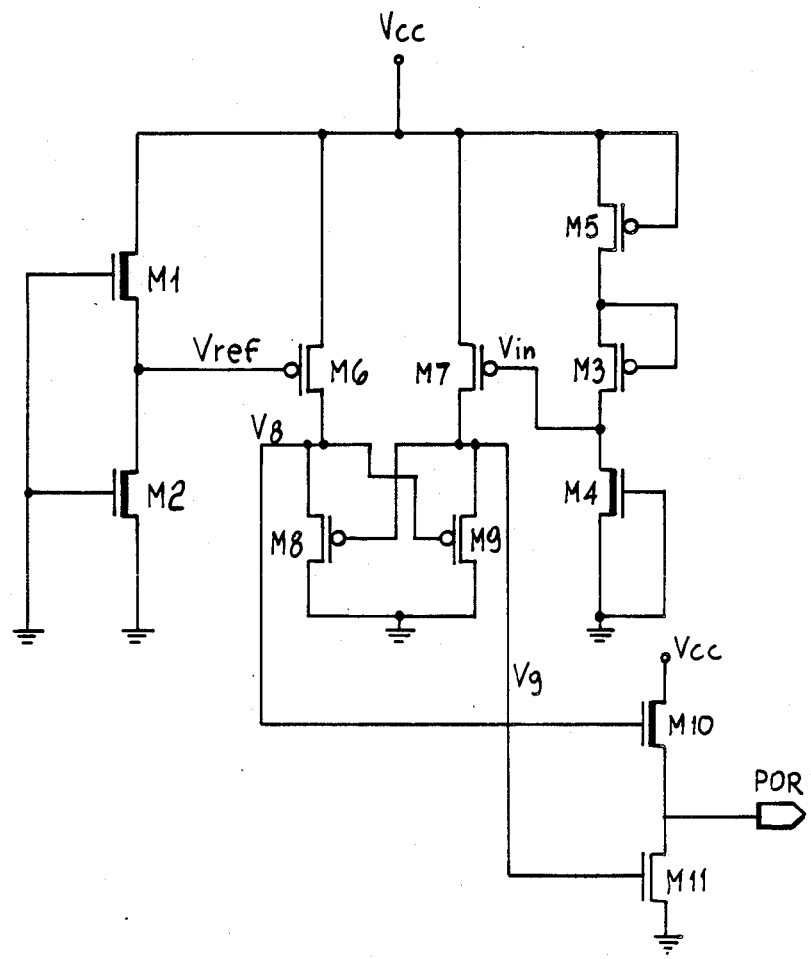
FIG. 2 is a diagram of the power-on reset circuit according to the preferred embodiment of the invention.

With reference to FIG. 2, the power-on reset circuit according to the preferred embodiment comprises a reference voltage generator constituted by two depletion transistors M1, M2, connected in series between the supply voltage $V_{cc}$ and the ground, and having their gates connected to the ground, therefore operating normally in the saturation region. The reference voltage signal $V_{ref}$ is supplied by the node between the source of the transistor M1 and the drain of the transistor M2.

Furthermore, the reset circuit comprises a voltage follower, comprising a depletion transistor M4, also having its gate connected to the ground, and having a load (connected to the supply $V_{cc}$) comprised of two natural transistors M3 and M5 in series and with their gates diode connected. The transistor M4 thus acts as a current generator, and the transistors M3 and M5 are equivalent to a resistive load. The follower comprised of transistors M3, M4, M5 supplies from the drain of transistor M4 a voltage signal which is hereinafter termed input signal $V_{in}$. The use of natural transistors for the load prevents the load from switching off when the supply voltage $V_{cc}$ drops.

Still with reference to FIG. 2, the power-on reset circuit furthermore comprises a bistable comparator, or "latch", constituted by four natural transistors M6, M7, M8, M9. The two transistors M8 and M9 are connected with their sources to the ground and have their gates connected with one another's drains to form a bistable circuit. Furthermore, the drains of transistors M8 and M9 reach the supply voltage $V_{cc}$ through the respective transistors M6 and M7, to the gates whereof the signals $V_{ref}$ and $V_{in}$ are, respectively, applied.

Finally, the drains of transistor M8 and M9 are respectively connected to the gates of two transistors M10 and M11, connected in series between the supply voltage $V_{cc}$ and the ground. The transistor M11 is of the enhancement type, while transistor M10 is of the depletion type. The complementary effect of the two transistors M10 and M11 is to improve the switching speed of the bistable comparator, providing at their node an output signal POR which is the required reset signal.

To explain the operation of the above described circuit, it should be observed that during the initial rise of the supply voltage the bistable comparator assumes the configuration with transistor M8 off transistor and M9 on, and therefore with $V_8$ high and $V_9$ low. In fact, the transistors M3, M5 do not conduct initially, and therefore keep transistor M7 off. Vice versa, transistor M1 is immediately on, and $V_8$ is forced high, and due to the regenerative effect of the bistable transistor M8 will remain off and transistor M9 on. This state is maintained until $V_{in}$, becoming greater than $V_{ref}$, causes the switching of the comparator.

In order to better understand the operation of the circuit, as well as the criteria for dimensioning, it should first be noticed that since the two transistors M1 and M2 are in their saturation region the following relation is valid: where W1, W2 and L1, L2 are respectively the channel widths and the channel lengths for the two transistors M1 and M2, $V_{Tdep}$ is the depletion threshold voltage, and k' is the product of the mobility of the charge carriers in the channel and of the capacity of the oxide layer. From (1), given $k = W2/L2 * L1/W1$, one obtains:

$$V_{ref} = -V_{Tdep}*(1-\sqrt{K}).$$

Preferably, $W1/L1 = 100/4$ and $W2/L2 = 3/40$ are used, so as to obtain $V_{ref} = 3$ volts. Depending on the structure of the reference voltage generator, and as is shown in FIG. 3, $V_{ref}$ reaches this value as soon as the supply allows it to, and then keeps rigorously constant.

Figure 3:
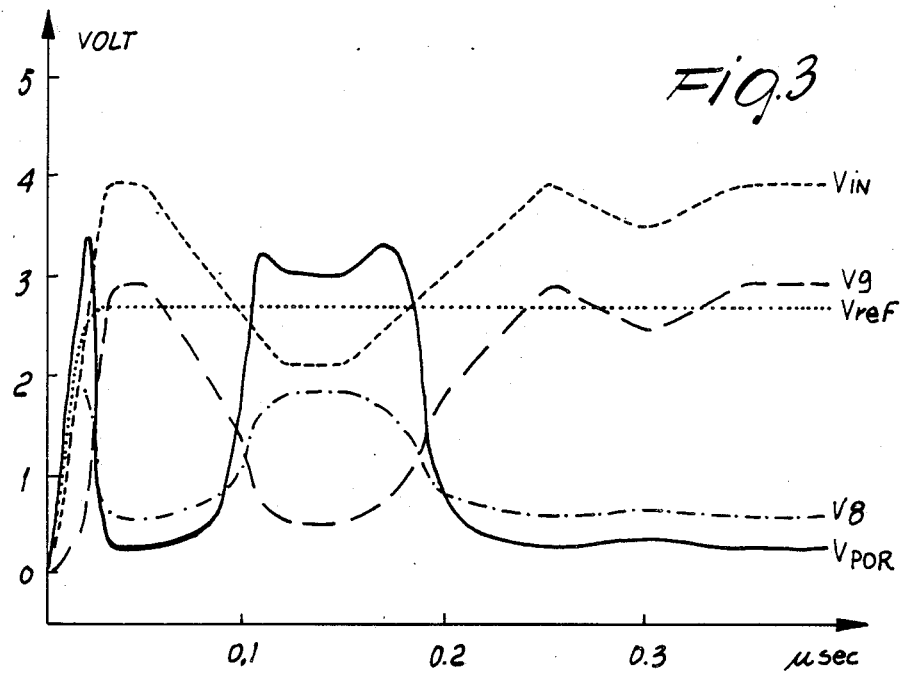
FIG. 3 is a diagram illustrating the behaviour, in time, of some voltages present in the operation of the circuit of FIG. 2.

FIG. 3 also illustrates how the circuit reswitches every time the supply voltage, of which $V_{in}$ is a reduced copy, drops below the required threshold.

So that the comparator may switch proximate to a supply voltage threshold of approximately 4 volts, as mentioned in the introduction, the follower must provide an input signal equal to 3 volts when $V_{cc} = 4$ volts, that is to say the substantially resistive load constituted by the transistors M3 and M5 provides a voltage drop of 1 volt for the current supplied by transistor M4. Indicating with W4 and L4 the width and length of the channel of transistor M4, the current $I_{dep}$ in the channel of transistor M4 is:

Indicating now with $V_x$ the potential of the node between the transistors M3 and M5, the current in the load of transistor M4, that is to say in transistor M3 (with obvious significance for W3 and L3) is where $v_x = (V_{cc} + V_{in})/2$, since the potential drops on transistor M5 and M3 are approximately equal. Equalizing (2) and (3), one thus obtains:

$$V_{in} = V_{cc} - 2*V_{Tdep}*K,$$

since
$W3/L3 = W5/L5 = 20/3$ and $W4/L4 = 3/15$ are chosen. One thus obtains $$V_{in} = V_{cc} - 0.6*y,$$

where y is a factor greater than one, which accounts for the so-called "body effect".

It is apparent that the use of four homogeneous (all natural) MOS transistor in the bistable comparator improves the rejection of the variations in the production process, since all the transistors are affected in the same manner. Furthermore, by virtue of the decoupling of the comparator both from the reference and from the follower, due to the presence of the transistors M6 and M7 controlled on the gate, dimensioning is very easy, and the triggering threshold is also easy to modify.

Analyzing the behaviour of the comparator in the region with loop gain smaller than 1, one can furthermore notice that the comparator has a differential-mode gain which can be given as high as required, while at the same time the common-mode gain tends to ½. This has the effect of improving the operating dynamics of the comparator, allowing its operation with a wide range of switching thresholds, and furthermore improves the certainty of operation even with small differences between the input voltages.

A preferred embodiment of the invention has been described, but naturally the same is susceptible to equivalent modifications and variations within the scope of the inventive concept.

We claim:

1. A power-on reset circuit for providing a reset pulse when the supply voltage rises above a preset threshold, said circuit comprising:
    (a) a reference voltage generator connected between the supply voltage and the ground, supplying a reference signal having a constant preset value when the supply voltage is higher than the preset threshold;
    (b) a supply follower providing an input signal which follows the supply voltage with a preset reduction factor;
    (c) a bistable comparator having a first input driven by said reference signal and a second input driven by said input signal and switching from a first initially assumed state to a second state when the input signal exceeds the reference signal;
    wherein said reference voltage generator
    comprises two depletion transistors coupled in series between the supply voltage and the ground, each having their gate connected to the ground, the node between said two transistors providing said reference signal.

2. A power-on reset circuit for providing a reset pulse when the supply voltage rises above a preset threshold, said circuit comprising:
    (a) a reference voltage generator connected between the supply voltage and the ground, supplying a reference signal having a constant preset value when the supply voltage is higher than the preset threshold;
    (b) a supply follower providing an input signal which follows the supply voltage with a preset reduction factor;
    (c) a bistable comparator having a first input driven by said reference signal and a second input driven by said input signal and switching from a first initially assumed state to a second state when the input signal exceeds the reference signal;
    wherein said supply follower comprises two natural transistor, each one being connected as a diode, coupled in series to one another and acting as load for a depletion transistor with grounded gate, the drain of said depletion transistor providing said input signal.

3. A power-on reset circuit for providing a reset pulse when the supply voltage rises above a preset threshold, said circuit comprising:
    (a) a reference voltage generator connected between the supply voltage and the ground, supplying a reference signal having a constant preset value when the supply voltage is higher than the preset threshold;
    (b) a supply follower providing an input signal which follows the supply voltage with a preset reduction factor;
    (c) a bistable comparator having a first input driven by said reference signal and a second input driven by said input signal and switching from a first initially assumed state to a second state when the input signal exceeds the reference signal;

wherein said bistable comparator comprises four natural transistors, arranged in pairs with the transistors of each pair connected in series between the supply voltage and the ground, the transistors connected to the
supply voltage having their gates driven respectively by said reference signal and by said input signal, the
transistors connected to the ground having their gates each respectively connected to the drain of the other transistor of the ground connected transistors.

4. A power-on reset
circuit for providing a reset pulse when the supply voltage rises above a preset threshold, said circuit comprising:
(a) a reference voltage generator connected between the supply voltage and the ground, supplying a reference signal having a constant preset value when the supply voltage is higher than the preset threshold;
(b) a supply follower providing an input signal which follows the supply voltage with a preset reduction factor;
(c) a bistable comparator having a first input driven by said reference signal and a second input driven by said input signal and switching from a first initially assumed state to a second state when the input signal exceeds the reference signal;
and fur her comprising an auxiliary stage, driven by the state of said bistable comparator, improving the switching speed of said bistable comparator.

5. A power-on reset circuit according to claim 4, whereas said auxiliary stage comprises a depletion transistor and an enhancement transistor coupled in series between the supply voltage and the ground, the gates whereof are connected to respective outputs of said bistable comparator.

6. A power-on reset circuit according to any one of claims 1-4 wherein said circuit is for the power on reset of logical integrated circuits in NMOS technology.

* * * * *